(12) United States Patent
Godali

(10) Patent No.: US 9,231,701 B2
(45) Date of Patent: Jan. 5, 2016

(54) ATTENUATION SYSTEMS WITH COOLING FUNCTIONS AND RELATED COMPONENTS AND METHODS

(71) Applicant: CORNING OPTICAL COMMUNICATIONS WIRLESS LTD, Airport (IL)

(72) Inventor: David Godali, Modi'in (IL)

(73) Assignee: Corning Optical Communications Wireless Ltd, Airport (IL)

( * ) Notice: Subject to any disclaimer, the term of this patent is extended or adjusted under 35 U.S.C. 154(b) by 31 days.

(21) Appl. No.: 14/469,873

(22) Filed: Aug. 27, 2014

(65) Prior Publication Data

US 2015/0062816 A1    Mar. 5, 2015

Related U.S. Application Data

(60) Provisional application No. 61/871,580, filed on Aug. 29, 2013.

(51) Int. Cl.
| | | |
|---|---|---|
| H05K 7/20 | (2006.01) |
| H01L 27/16 | (2006.01) |
| H04B 10/2575 | (2013.01) |
| H01L 35/28 | (2006.01) |

(52) U.S. Cl.
CPC .......... *H04B 10/25753* (2013.01); *H01L 35/28* (2013.01)

(58) Field of Classification Search
CPC .......... H05K 7/20; H01L 27/16; H01L 35/28; H02J 9/061; H04B 10/40; H04B 10/25753; H04B 10/25775; G02B 6/2552; G02B 6/4227; G02F 1/01; G06F 1/203
USPC ........ 361/679.46–679.56, 690–697, 361/700–712, 715, 719–724; 165/80.2, 165/80.3, 80.4, 80.5, 104.33, 104.34, 185; 174/15.1, 16.3, 252, 254, 520, 548; 257/706–727; 385/123, 140; 398/42, 398/67, 83, 115, 201
See application file for complete search history.

(56) References Cited

U.S. PATENT DOCUMENTS

| | | | |
|---|---|---|---|
| 5,974,556 A | 10/1999 | Jackson et al. ................ 713/322 |
| 6,208,798 B1* | 3/2001 | Morozov ............ G02B 6/2552 | 385/140 |
| 6,773,532 B2* | 8/2004 | Wolf ................... G02B 6/4277 | 156/182 |
| 7,732,780 B2* | 6/2010 | Kindem .................. G01T 7/00 | 250/370.15 |
| 7,787,728 B2* | 8/2010 | Masterson ................ G01J 3/02 | 356/73.1 |
| 8,055,925 B2 | 11/2011 | Goodnow et al. ............ 713/340 |
| 8,099,617 B2 | 1/2012 | Kim ............................. 713/340 |
| 8,326,156 B2* | 12/2012 | Stewart ............ H04B 10/25753 | 398/115 |
| 8,390,244 B2 | 3/2013 | Wooley et al. ................ 310/103 |
| 8,462,499 B2* | 6/2013 | Nishioka ................ G06F 1/203 | 174/548 |
| 8,468,837 B2* | 6/2013 | Pinet ....................... F25B 21/02 | 363/39 |
| 8,519,566 B2 | 8/2013 | Recker et al. ................... 307/64 |
| 2002/0121094 A1* | 9/2002 | VanHoudt ............... F25B 21/04 | 62/3.3 |
| 2006/0113955 A1* | 6/2006 | Nunally .................. H02J 7/025 | 320/108 |
| 2011/0083710 A1 | 4/2011 | Hsu .............................. 136/205 |
| 2011/0170880 A1* | 7/2011 | Daghighian ........... H04B 10/40 | 398/201 |
| 2012/0038175 A1 | 2/2012 | Tang et al. ..................... 290/1 R |
| 2012/0089854 A1 | 4/2012 | Breakstone et al. .......... 713/323 |

* cited by examiner

FOREIGN PATENT DOCUMENTS

| | | | | |
|---|---|---|---|---|
| GB | 002360601 A * | 9/2001 | ............ G02F 1/0121 |
| WO | WO2004/011861 A1 * | 2/2004 | ............. F25B 21/04 |

*Primary Examiner* — Michail V Datskovskiy

(57) ABSTRACT

Attenuation systems have cooling components that produce power in response to heat generated by the attenuator. The cooling components can be used to power cooling fans if a primary power source of the fans fails.

24 Claims, 4 Drawing Sheets

ATTENUATION SYSTEMS WITH COOLING FUNCTIONS AND RELATED COMPONENTS AND METHODS

RELATED APPLICATIONS

This application claims the benefit of priority under 35 U.S.C. §119 of U.S. Provisional Application No. 61/871,580 filed on Aug. 29, 2013, the content of which is relied upon and incorporated herein by reference in its entirety.

BACKGROUND

1. Field of the Disclosure

The technology of the disclosure relates to cooling systems and related components and methods.

2. Technical Background

Wireless communications are subject to increasing demands for high-speed mobile data communications. "Wireless fidelity" or "WiFi" systems and wireless local area networks (WLANs) are now deployed in many different types of areas to provide wireless services. Distributed antenna systems also provide a variety of wireless services by communicating with wireless devices called "client devices" which must reside within the wireless range or "cell coverage area." Distributed antenna systems are particularly useful inside buildings or other indoor environments where client devices may not otherwise receive radio frequency (RF) signals. Distributed antenna systems have RF antenna coverage areas, also referred to as "antenna coverage areas," having a relatively short range.

FIG. 1 is a schematic diagram of an optical fiber-based distributed antenna system (DAS) 10. The system 10 generates antenna coverage areas for establishing communication with wireless client devices located within the RF range of the antenna coverage areas. The DAS 10 includes a central unit or head-end unit (HEU) 12, remote antenna units (RAUs) 14, and an optical fiber link 16 that couples the HEU 12 to the RAU 14. The HEU 12 receives communications over downlink electrical RF signals 18D from a source or sources and provides the communications to the RAU 14. The downlink communication signals are received through a downlink input. The HEU 12 is also configured to return communications received from the RAU 14, via uplink electrical RF signals 18U, back to the sources. The optical fiber link 16 includes downlink optical fibers 16D to carry signals communicated from the HEU 12 to the RAU 14 and uplink optical fibers 16U to carry signals communicated from the RAU 14 back to the HEU 12. An interface couples the HEU 12 to the optical fiber link 16 by receiving downlink signals and passing them to the RAU 14 through the link 16.

The DAS 10 has an antenna coverage area 20 that can be substantially centered about the RAU 14. The antenna coverage area 20 of the RAU 14 forms an RF coverage area. The HEU 12 performs a number of Radio-over Fiber (RoF) applications, such as radio-frequency identification (RFID), WLAN communication, and cellular phone service. Client devices 24 in the coverage area 20 can be mobile terminals such as cellular telephones, smart phones, or tablet computers. The client device 24 includes an antenna 26 for receiving and/or sending RF signals. The HEU 12 includes an electrical-to-optical (E/O) converter 28 to communicate downlink electrical RF signals over the downlink optical fiber 16D to the RAU 14, to in turn be communicated to the client device 24 in the antenna coverage area 20 formed by the RAU 14. The E/O converter 28 converts the downlink electrical RF signals 18D to downlink optical RF signals 22D to be communicated over the downlink optical fiber 16D. The RAU 14 includes an optical-to-electrical (O/E) converter 30 to convert received downlink optical RF signals back to electrical signals to be communicated wirelessly through an antenna 32 to client devices 24 located in the antenna coverage area 20. The antenna 32 receives wireless RF communication from client devices 24 and communicates electrical RF signals representing the wireless RF communication to an E/O converter 34 in the RAU 14. The E/O converter 34 converts the electrical RF signals into uplink optical RF signals 22U to be communicated over the uplink optical fiber 16U. An O/E converter 36 in the HEU 12 converts the uplink optical RF signals 16U into uplink electrical RF signals, which are then communicated as uplink electrical RF signals 18U back to a network. The RAU 14 can include a controller 40 to facilitate one or more operations of the RAU.

DASs and other wireless systems are usually fed by a base station, a repeater, or other RF source that provides output power in a specified range. Since DAS equipment is usually designed to operate with lower input power than that of the source, the signal is attenuated between the DAS and the source. Since attenuators may need to dissipate high power, they are often cooled by fans. Failures of such fans can result in damage caused by electronic components.

SUMMARY

One embodiment is addressed to a communication system comprising a signal source, a system communicatively coupled to the signal source in order to receive signals from the source, the system including remote units configured to wirelessly transmit RF signals into a respective coverage area and to receive wireless RF signals from the coverage area; and an attenuation system interposed between the signal source and the system to attenuate signals from the source. The attenuation system comprises an attenuator configured to attenuate signals, a thermoelectric cooling component configured to absorb heat generated by the attenuator and to generate electrical current in response to the heat, and a cooling device in electrical communication with the thermoelectric cooling component and arranged to cool the attenuator when powered by the thermoelectric cooling component.

A further embodiment is addressed to a method of operating a communication system having an attenuation system comprising an attenuator configured to attenuate signals, a thermoelectric cooling component configured to absorb heat generated by the attenuator, and a cooling device in electrical communication with the thermoelectric cooling component and arranged to cool the attenuator. The method comprises providing a signal to the attenuation system, attenuating the signal in the attenuation system so that the attenuator generates heat in response to attenuating the signal, at the thermoelectric cooling component, generating an electrical current in response to the heat generation, providing the electrical current to the cooling device, and from a plurality of remote units, wirelessly transmitting signals into respective coverage areas. The cooling device may be coupled to a power source, and electrical current form the thermoelectric cooling component can be provided to the cooling device in the event of the cessation of power or a reduction of power supplied by the power source.

Additional features and advantages will be set forth in the detailed description which follows. The foregoing general description and the following detailed description are merely exemplary. The accompanying drawings are included to provide a further understanding, and are incorporated in and constitute a part of this specification. The drawings illustrate one or more embodiment(s), and together with the description serve to explain principles and operation of the various embodiments.

DETAILED DESCRIPTION

According to one aspect of the present embodiments, a mechanism for ensuring operation of cooling fans during power breaks serves to avoid overheating of an attenuator and possible damage to the attenuator and/or other electronic components. In one embodiment, the mechanism uses modules that produce electrical power in response to heat flow across the module.

Figure 1:
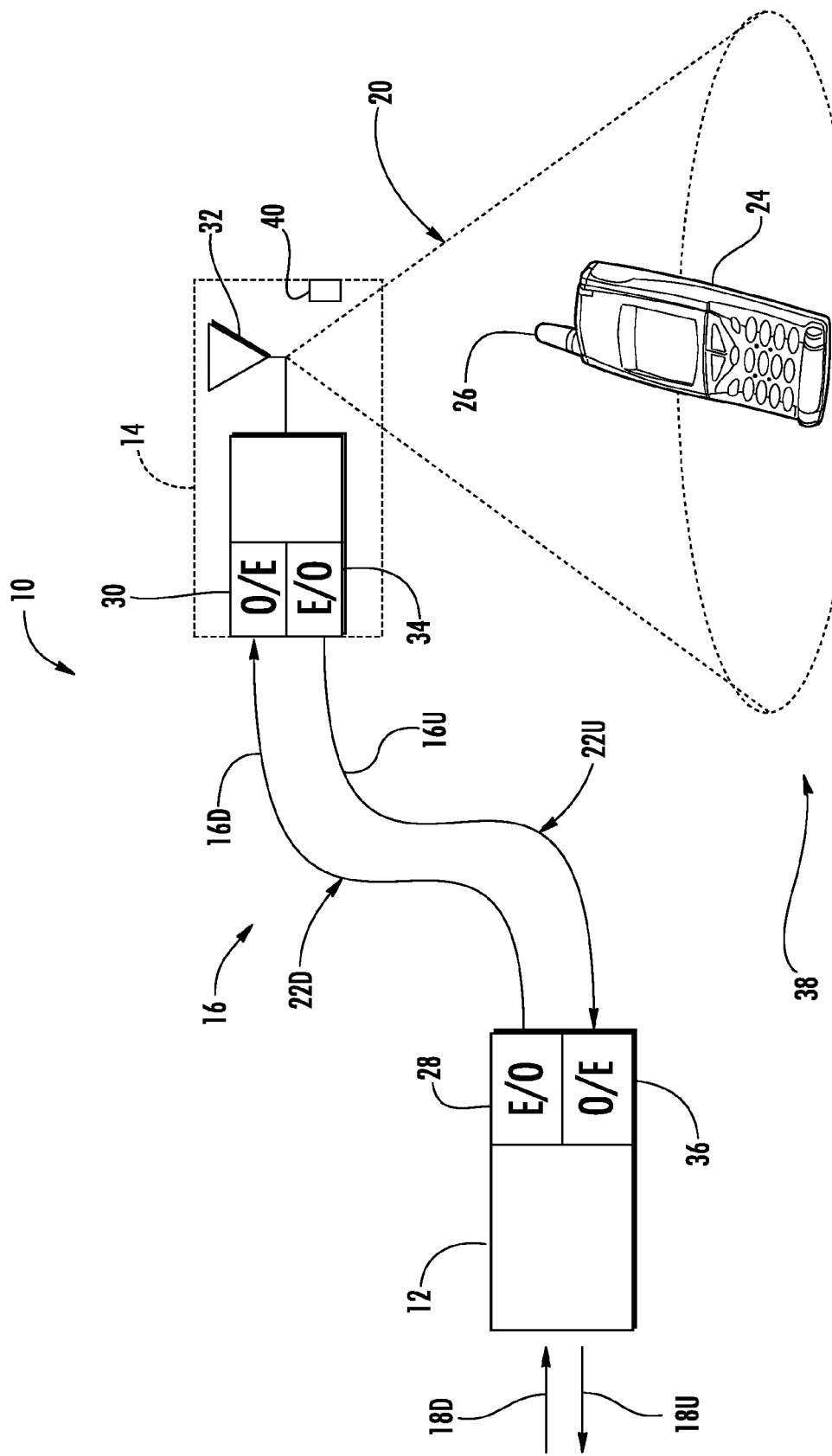
FIG. 1 is a schematic diagram of a distributed communication system.
Figure 2:
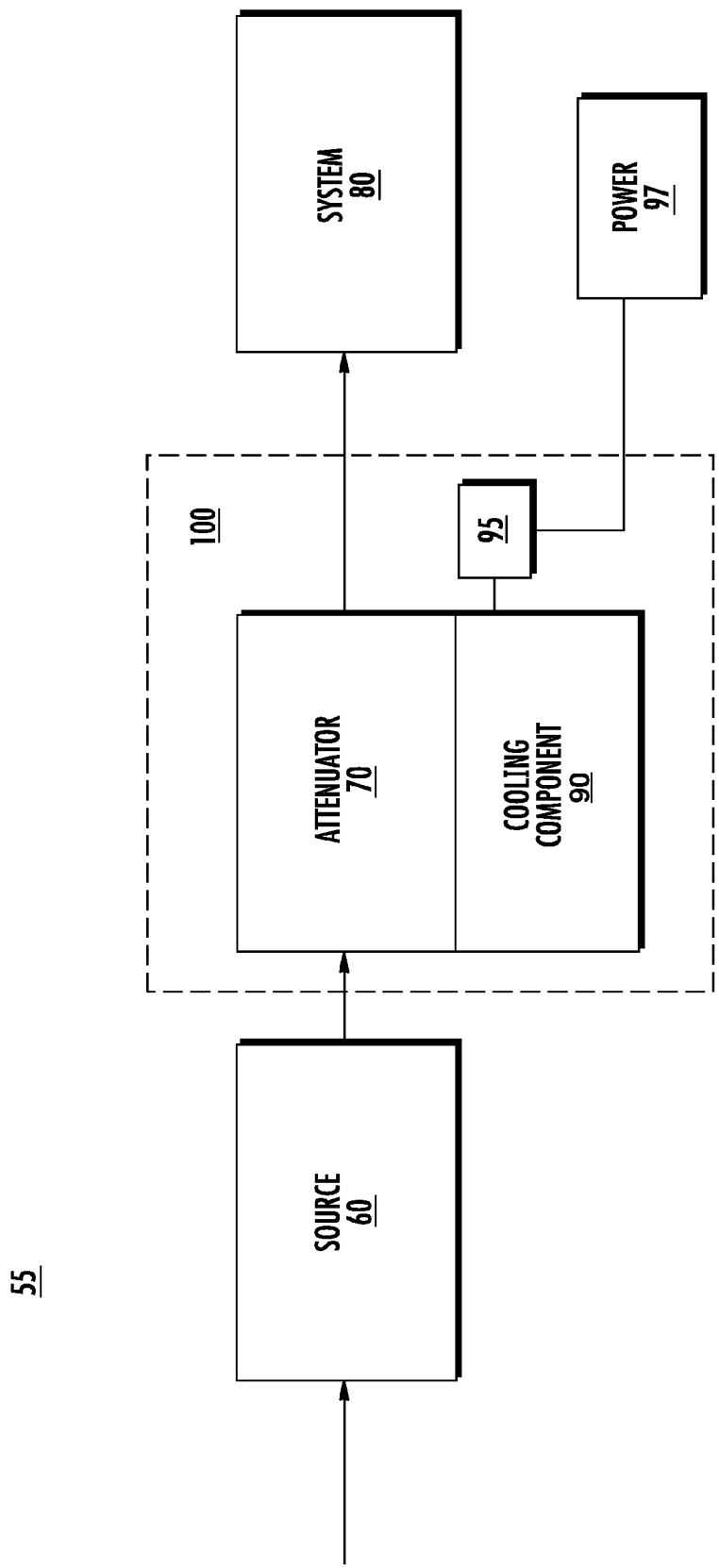
FIG. 2 is a schematic representation of a system receiving an attenuated signal from a source by way of an attenuation system according to a first embodiment.

FIG. 2 is a schematic representation of a system 55 having a signal source 60 that provides signals to a system 80, where the signals are attenuated in an attenuation system 100. The system 55 may be, for example, a communication system for the distribution of RF signals. The system 80 can be any system that processes, retransmits, or otherwise utilizes the signals from the source 60. In one exemplary embodiment, the system 80 corresponds to a distributed communication system, such as the DAS 10 illustrated in FIG. 1. The source 60 can be, for example, a base transceiver station (BTS), a small cell, a repeater, or similar source which may be provided by a second party such as a cellular service provider. The source 60 can be co-located with or located remotely from the DAS 10.

The attenuation system 100 is designed to continue to operate during power breaks. The system 100 includes an attenuator 70 that attenuates the signal(s) from the source 60 before forwarding it to the system 80. Because attenuators generate heat during operation, a cooling component 90, and a cooling device 95 such as a fan, or a group of fans, are provided with the attenuator 70 to cool the attenuator. The cooling device 95 can be powered locally, for example, by a power source 97. The exemplary embodiment illustrates one mode of operation of the system 55, where a signal direction is from the source 60, through the attenuation system 100, to the system 80. This signal would be considered a downlink signal if, for example, the signal input to the source 60 were from a network, and the system 80 were a distributed communication system as shown in FIG. 1. The principles of the invention also apply, however, to signal flow in the uplink direction.

The power source 97 is expected to power the fan 95 during normal operation of the system 55, and could be connected to a building infrastructure's system for electrical power. If for some reason the power source 97 fails (e.g., by a reduction and/or cessation of supplied power) temporarily or for long periods, the cooling component 90 is activated to power the fan 95, or alternative fan(s) associated with the cooling component 90, to continue cooling the attenuator 70. This function allows the system 80 to continue operating without the risk of the attenuator 70 overheating.

Figure 3:
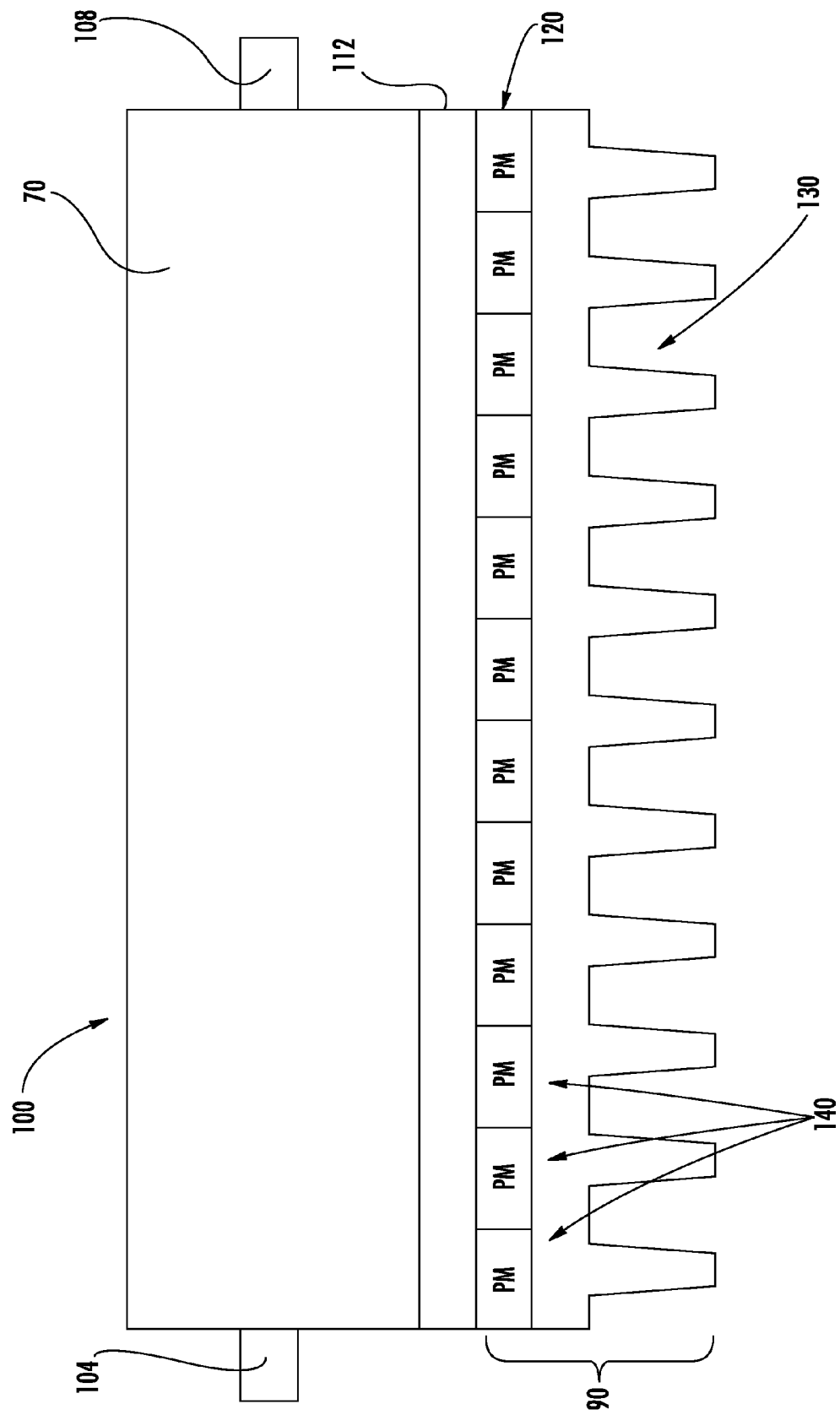
FIG. 3 is a partial schematic diagram of an attenuator and a cooling component of the attenuation system of FIG. 2.

The cooling component 90 can include one or more elements, or modules, that produce electrical power in response to heat flow across the module. The electrical power is used to power the cooling device 95 during power breaks. FIG. 3 is an isolated section view of the attenuator 70 and the cooling component 90. The attenuator 70 has a first, source port 104 that can be, for example, configured to receive signals from an RF source such as a base station. A second port 108 is configured to provide attenuated signals from the source 60 to a system, such as the system 80.

The attenuator 70 includes a first, hot side heat sink 112 on the side that is in thermal communication with the cooling component 90. The cooling component 90 includes a thermoelectric component 120 in thermal contact with and arranged to receive thermal energy from the heat sink 112. During operation of the system 55, heat flow from the attenuator 70 crosses the thermoelectric component 120 and is dissipated from a second, ventilated cold side heat sink 130 in thermal communication with the thermoelectric component.

The thermoelectric component 120 is configured to produce electrical power in response to heat flow across the component 120. The ability of heat flux between two different types of material to generate electricity is known as the Peltier effect, or more generally as the thermoelectric effect. The exemplary thermoelectric component 120 includes a plurality of Peltier modules (PM) 140. A Peltier cooler module is a solid-state active in which the transfer of heat from a hot side (at the heat sink 112 in FIG. 3) to a cool side, (the second, cold side heat sink 130 in FIG. 3) results in the generation of electrical energy. As the hot side is heated to a temperature greater than the cool side, a voltage difference builds between the two sides due to the Seebeck Effect. In a Peltier module, semiconductors of different electron densities, such as p-type and n-type, are placed electrically in series and thermally in parallel. A thermal gradient across the parallel connection of p-type and n-type materials results in a current along the serial electrical connection. A larger number and efficacy of p-n pairs provides a greater ability to generate electrical current.

The series electrical connection of thermoelectric modules 140 can be electrically connected to the cooling device 95 such that when the primary power source for the cooling device 95 fails, electrical current generated by the cooling component 90 continues to power the cooling device 95, or, another cooling device coupled to the cooling component.

In one application, attenuation system 100 is designed to operate in conjunction with a distributed communication system, corresponding to the DAS 10, and a BTS. DASs are typically fed by a base station or other RF source that provides output power in the range of 4-20 Watts. The head end equipment for the DAS 10 may be designed to operate with lower input power, such as in the range of 0.1-0.5 W. The attenuation system 100 is therefore configured to attenuate signals from the BTS so that they are of suitable power for use by the DAS. During operation, the attenuator 70 will absorb high power (up to 20 W in some applications) and the cooling device 95, usually including multiple fans, is used to cool the attenuator 70. If local building infrastructure power to the cooling device 95 fails, the high power absorption by the attenuator 70 generates the heat needed to operate the thermoelectric component 120 to in turn power the cooling device 95.

In another example, the cooling device 95 includes four fans to cool the cold side ventilated heat sink 130 at or below a temperature of 60° C. The power dissipated by the attenuator 70 is 10 W, and the heat dissipation properties of the system are designed such that the first, hot side attenuator heat sink 112 is 90° C., or 30° C. higher than the temperature of the second, cold side ventilated heat sink 130.

Figure 4:
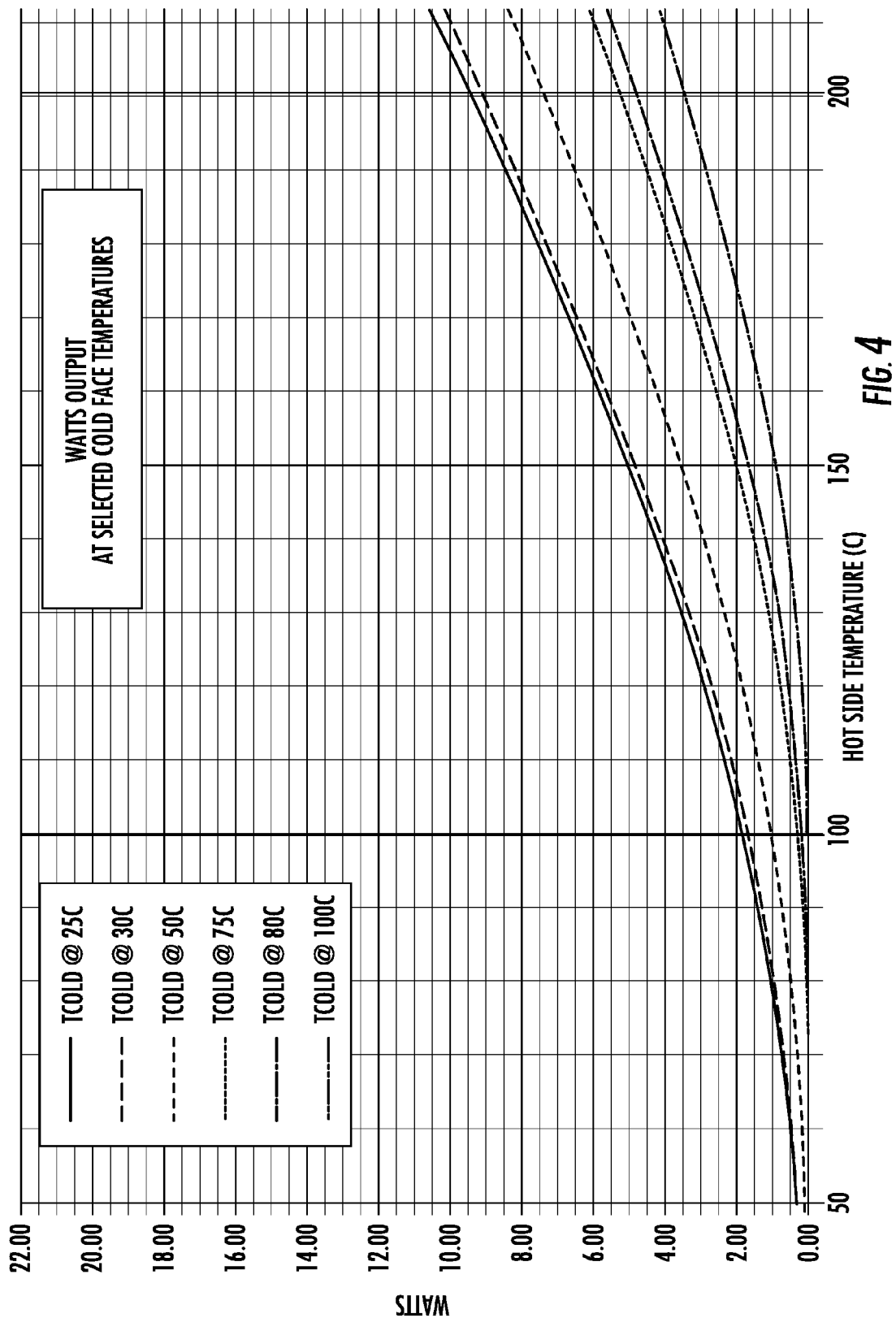
FIG. 4 is a plot of output power versus hot side temperature at different cold side temperatures.

FIG. 4 is a plot of output power versus hot side temperature at different cold side temperatures. Still referring to FIG. 3 and also to the plot in FIG. 4, under certain conditions one exemplary Peltier module produces an electric power of 1 W. If four fans are used to cool the heat sink and keeping it at a maximum temperature of 50° C. Each fan may require 2.5 W of power, so that four fans require about 10 W. Since, under the certain conditions, each Peltier module generates about 1 W, at least ten Peltier modules would be used in the cooling component 120. The power from the Peltier modules may need to be combined and processed through a power converter (not shown) to output a desired voltage and current to operate the fans. Thus, additional Peltier modules may be included to account for losses in power conversion.

The distributed communications systems disclosed in this specification are configured to provide digital data services. Examples of digital data services provided with digital data signals include, but are not limited to, Ethernet, WLAN, WiMax, WiFi, Digital Subscriber Line (DSL), and LTE, etc. Ethernet standards could be supported, including but not limited to 100 Megabits per second (Mbs) (i.e., fast Ethernet) or Gigabit (Gb) Ethernet, or ten Gigabit (10G) Ethernet. Examples of RF communication services provided with RF communication signals include, but are not limited to, US FCC and Industry Canada frequencies (824-849 MHz on uplink and 869-894 MHz on downlink), US FCC and Industry Canada frequencies (1850-1915 MHz on uplink and 1930-1995 MHz on downlink), US FCC and Industry Canada frequencies (1710-1755 MHz on uplink and 2110-2155 MHz on downlink), US FCC frequencies (698-716 MHz and 776-787 MHz on uplink and 728-746 MHz on downlink), EU R & TTE frequencies (880-915 MHz on uplink and 925-960 MHz on downlink), EU R & TTE frequencies (1710-1785 MHz on uplink and 1805-1880 MHz on downlink), EU R & TTE frequencies (1920-1980 MHz on uplink and 2110-2170 MHz on downlink), US FCC frequencies (806-824 MHz on uplink and 851-869 MHz on downlink), US FCC frequencies (896-901 MHz on uplink and 929-941 MHz on downlink), US FCC frequencies (793-805 MHz on uplink and 763-775 MHz on downlink), and US FCC frequencies (2495-2690 MHz on uplink and downlink), and medical telemetry frequencies.

The embodiments disclosed herein include various steps that may be performed by hardware components or embodied in machine-executable instructions, which may be used to cause a general-purpose or special-purpose processor programmed with the instructions to perform the steps. Alternatively, the steps may be performed by a combination of hardware and software.

The operational steps described in any of the embodiments herein are described to provide examples and discussion, and may be performed in different sequences other than the illustrated sequences. Operations described in a single step may actually be performed in a number of different steps, and one or more operational steps may be combined. Data, instructions, commands, information, bits, symbols, and chips that may be referenced throughout the above description may be represented by voltages, currents, electromagnetic waves, magnetic fields or particles, optical fields or particles, or any combination thereof.

The terms "fiber optic cables" and/or "optical fibers" include all types of single mode and multi-mode light waveguides, including one or more optical fibers that may be upcoated, colored, buffered, ribbonized and/or have other organizing or protective structure in a cable such as one or more tubes, strength members, jackets, or the like.

The antenna arrangements disclosed herein may include any type of antenna desired, including but not limited to dipole, monopole, bowtie, inverted F, wireless cards, and slot antennas. The distributed antenna systems disclosed herein could include any type or number of communication mediums, including but not limited to electrical conductors, optical fiber and optical cable, and air (i.e., wireless transmission).

A BTS may be any station or source that provides an input signal to a wireless system and that can receive a return signal from the wireless system. In a typical cellular system, for example, a plurality of BTSs are deployed at a plurality of remote locations to provide wireless telephone coverage. Each BTS serves a corresponding cell and when a mobile station enters the cell, the BTS communicates with the mobile station. Each BTS can include at least one radio transceiver for enabling communication with one or more subscriber units operating within the associated cell.

Various modifications and variations can be made without departing from the scope of the invention. Since modifications combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A communication system, comprising:
   a signal source;
   a system communicatively coupled to the signal source in order to receive signals from the source, the system including remote units configured to wirelessly transmit RF signals into a respective coverage area and to receive wireless RF signals from the coverage area; and
   an attenuation system interposed between the signal source and the system to attenuate signals from the source, the attenuation system comprising:
      an attenuator configured to attenuate signals;
      a thermoelectric cooling component configured to absorb heat generated by the attenuator and to generate electrical current in response to the heat; and
      a cooling device in electrical communication with the thermoelectric cooling component and arranged to cool the attenuator when powered by the thermoelectric cooling component.

2. The communication system of claim 1, wherein the thermoelectric cooling component comprises a plurality of thermoelectric modules configured to generate electrical current in response to heat flow.

3. The communication system of claim 2, wherein the thermoelectric modules comprise a first semiconductor of a first electron density and a second semiconductor of a second electron density different than the first electron density.

4. The communication system of claim 3, wherein the first semiconductor is a p-type semiconductor and the second semiconductor is an n-type semiconductor.

5. The communication system of claim 1, wherein the cooling device comprises at least one fan.

6. The communication system of claim 1, wherein the cooling device is coupled to a power source, and wherein the thermoelectric cooling component is configured to provide electric power to the cooling device when the power source fails.

7. The communication system of claim 1, wherein the signal source is a radio frequency (RF) signal source configured to provide RF signals to the system.

8. The communication system of claim 7, wherein the system is a distributed communication system comprising head end equipment communicatively coupled to the remote units configured to receive and distribute the RF signals.

9. The communication system of claim 1, wherein:
the thermoelectric cooling component comprises a plurality of thermoelectric modules configured to generate electrical current in response to heat flow, the thermoelectric modules comprising a first semiconductor of a first electron density and a second semiconductor of a second electron density different than the first electron density; and
the cooling device comprises at least one fan coupled to a power source, and wherein the thermoelectric cooling component is configured to provide electric power to the cooling device when the power source fails.

10. The communication system of claim 9, wherein:
the system is a distributed communication system comprising head end equipment communicatively coupled to the remote units configured to receive and distribute the RF signals; and
the signal source is a radio frequency (RF) signal source configured to provide downlink RF signals to the system and receive uplink signals from the head equipment.

11. A method of operating a communication system having an attenuation system comprising an attenuator configured to attenuate signals, a thermoelectric cooling component configured to absorb heat generated by the attenuator, and a cooling device in electrical communication with the thermoelectric cooling component and arranged to cool the attenuator, the method comprising:
providing a signal to the attenuation system;
attenuating the signal in the attenuation system so that the attenuator generates heat in response to attenuating the signal;
at the thermoelectric cooling component, generating an electrical current in response to the heat generation;
providing the electrical current to the cooling device; and
from a plurality of remote units, wirelessly transmitting signals into respective coverage areas.

12. The method of claim 11, wherein the thermoelectric cooling component comprises a plurality of thermoelectric modules configured to generate electrical current in response to heat flow.

13. The method of claim 12, wherein the thermoelectric modules comprise a first p-type semiconductor of a first electron density and a second n-type semiconductor of a second electron density different than the first electron density.

14. The method of claim 13, wherein the cooling device comprises at least one fan.

15. The method of claim 14, wherein the cooling device is coupled to a power source, and wherein providing electrical current to the cooling device occurs when the power source fails.

16. The method of claim 14, wherein providing a signal to the attenuation system comprises transmitting an RF signal.

17. The method of claim 14, further comprising providing the attenuated signals to a distributed communication comprising the remote units, and head end equipment configured to receive and distribute the attenuated signal to the remote units.

18. An attenuation system, comprising:
an attenuator configured to attenuate signals from a source;
a thermoelectric cooling component configured to absorb heat generated by the attenuator and to generate electrical current in response to the heat; and
a cooling device in electrical communication with the thermoelectric cooling component and arranged to cool the attenuator when powered by the thermoelectric cooling component.

19. The attenuation system of claim 18, wherein the source is an RF signal source.

20. The attenuation system of claim 18, wherein the thermoelectric cooling component comprises a plurality of thermoelectric modules configured to generate electrical current in response to heat flow.

21. The attenuation system of claim 20, wherein the thermoelectric modules comprise a first semiconductor of a first electron density and a second semiconductor of a second electron density different than the first electron density.

22. The attenuation system of claim 21, wherein the first semiconductor is a p-type semiconductor and the second semiconductor is an n-type semiconductor.

23. The attenuation system of claim 22, wherein the cooling device comprises a plurality of fans.

24. The attenuation system of claim 22, wherein the cooling device is coupled to a power source, and wherein the thermoelectric cooling component is configured to provide electric power to the cooling device when the power source fails.

* * * * *